(12) United States Patent
Bouas et al.

(10) Patent No.: US 7,590,954 B2
(45) Date of Patent: Sep. 15, 2009

(54) TEST SOLUTION DEVELOPMENT METHOD

(75) Inventors: Spiros Nikolaos Bouas, San Francisco, CA (US); Benny Madsen, Los Altos, CA (US); Christian Olgaard, Sunnyvale, CA (US); Greg Ravenscroft, Fremont, CA (US)

(73) Assignee: LitePoint Corp., Sunnyvale, CA (US)

( * ) Notice: Subject to any disclaimer, the term of this patent is extended or adjusted under 35 U.S.C. 154(b) by 338 days.

(21) Appl. No.: 11/554,815

(22) Filed: Oct. 31, 2006

(65) Prior Publication Data

US 2008/0127008 A1 May 29, 2008

(51) Int. Cl.
*G06F 17/50* (2006.01)
(52) U.S. Cl. .............................. 716/4; 716/5
(58) Field of Classification Search ............. 716/5, 716/4
See application file for complete search history.

(56) References Cited

U.S. PATENT DOCUMENTS

| 6,904,577 | B2 * | 6/2005 | Schubert et al. ............ 716/4 |
| 7,137,083 | B2 * | 11/2006 | Hildebrant ................ 716/4 |
| 7,353,468 | B2 * | 4/2008 | Ferguson et al. .......... 716/4 |
| 2002/0144212 | A1 | 10/2002 | Lev et al. |
| 2004/0201041 | A1 | 10/2004 | Modok et al. |
| 2004/0225465 | A1 | 11/2004 | Pramanick et al. |
| 2005/0246287 | A1 | 11/2005 | Lee et al. |

OTHER PUBLICATIONS

International Search Report for PCT/US07/68451, dated Feb. 29, 2008, 3 pages.
Written Opinion for PCT/US07/68451, dated Feb. 29, 2008, 3 pages.

* cited by examiner

*Primary Examiner*—Jack Chiang
*Assistant Examiner*—Brandon W Bowers
(74) *Attorney, Agent, or Firm*—Vedder Price P.C.

(57) ABSTRACT

A test solution for one or more circuits implementing a communication standard is based on a design specification received from a development organization and a communication standard. The test solution is evaluated with one or more prototype circuits and is selectively modified based on the evaluation with the prototype circuits. The test solution is then evaluated with one or more manufactured circuits and is selectively modified based on the evaluation with the manufactured circuits.

2 Claims, 3 Drawing Sheets

TEST SOLUTION DEVELOPMENT METHOD

BACKGROUND OF THE INVENTION

1. Field of the Invention

The present disclosure generally relates to development of test solutions, and more particularly to development of test solutions for communications circuits.

2. Description of the Related Art

Wireless communication devices are becoming increasingly prevalent in the daily lives of many people. With many applications already in existence, and increasing numbers of applications already planned, the designs for these wireless devices have been moving from being driven by technology to becoming commodities where cost becomes the critical feature. Accordingly, the integration level of the individual integrated circuits, as well as chip sets, used for these devices has increased, thereby lowering many costs, particularly at the system level. As a result of this, production testing and adjusting of these devices is now becoming a larger factor in terms of unit costs. Accordingly, lower costs for performing these tests is becoming increasingly critical.

In one method, costs may be reduced by preventing defective devices from reaching a consumer. FIG. 1 depicts a functional block diagram of entities typically involved in creating circuits that implement a communication standard such as IEEE 802.11, 802.16, 802.22, and other suitable communication standards. A development organization 12 typically designs and develops circuits that substantially conform to the communication standard, but does not manufacture the circuits. The development organization 12 may create a design specification for the circuit that substantially conforms with the communication standard.

The development organization 12 typically uses a manufacturing organization 14 to mass produce manufactured circuits that substantially conform to the design specification. The manufacturing organization 14 and the development organization 12 are typically in different geographic locations.

The manufacturing organization 14 typically works with a test solution organization 16 to create a test solution. The test solution, which may include test circuits and/or test software, is used as a quality control measure to verify whether the manufactured circuits substantially conform to the design specification and the communication standard.

The test solution typically requires customization to be implemented within the manufacturing organization 14. Therefore, the test solution organization 16 and the manufacturing organization 14 work closely (typically in the same geographical location) to create a customized test solution once the design specification is received from the development organization 12. Customization of the test solution may be iterative and time consuming. This time consuming process adversely affects when a consumer 18 can receive the manufactured circuits, which is undesirable.

It is therefore desirable to provide, among other things, a method of developing a test solution with a reduced time to market.

SUMMARY OF THE INVENTION

In accordance with the presently claimed invention, a test solution for one or more circuits implementing a communication standard is based on a design specification received from a development organization and a communication standard. The test solution is evaluated with one or more prototype circuits and is selectively modified based on the evaluation with the prototype circuits. The test solution is then evaluated with one or more manufactured circuits and is selectively modified based on the evaluation with the manufactured circuits.

In accordance with one embodiment of the presently claimed invention, a method of developing a test solution for one or more integrated circuits (ICs) that implement a communication standard includes receiving a design specification for at least a portion of the one or more ICs from a development organization. The method includes receiving a communication standard for the one or more ICs. The method includes designing a draft test solution for the one or more ICs in at least substantial conformance with the communication standard and the design specification. The method includes receiving at least one prototype of the one or more ICs from the development organization. The method includes evaluating the draft test solution based on at least one interaction between the at least one prototype and the draft test solution. The method includes selectively modifying the draft test solution based on the at least one interaction to produce a proposed test solution. The method includes receiving, from one or more entities including a manufacturing organization, at least one of each of the one or more ICs at least a portion of which is manufactured substantially in conformance with the design specification. The method includes evaluating the proposed test solution based on at least another interaction between the manufactured one or more ICs and the proposed test solution. The method includes selectively modifying the proposed test solution based on the at least another interaction to produce a production test solution.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

As used herein, the term circuit can include an electronic circuit, an integrated circuit, a chipset or a portion thereof, one or more processors (e.g., shared, dedicated, or group of processors such as but not limited to microprocessors, DSPs, or central processing units) and memory that execute one or more software or firmware programs, a combinational logic circuit, an ASIC, and/or other suitable components that provide the described functionality.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

As will be discussed in more detail below, the presently claimed invention provides a method of developing a test solution with a reduced time to market. The method also reduces costs associated with manufacturing a communication circuit due to the reduced time to market.

Figure 1:
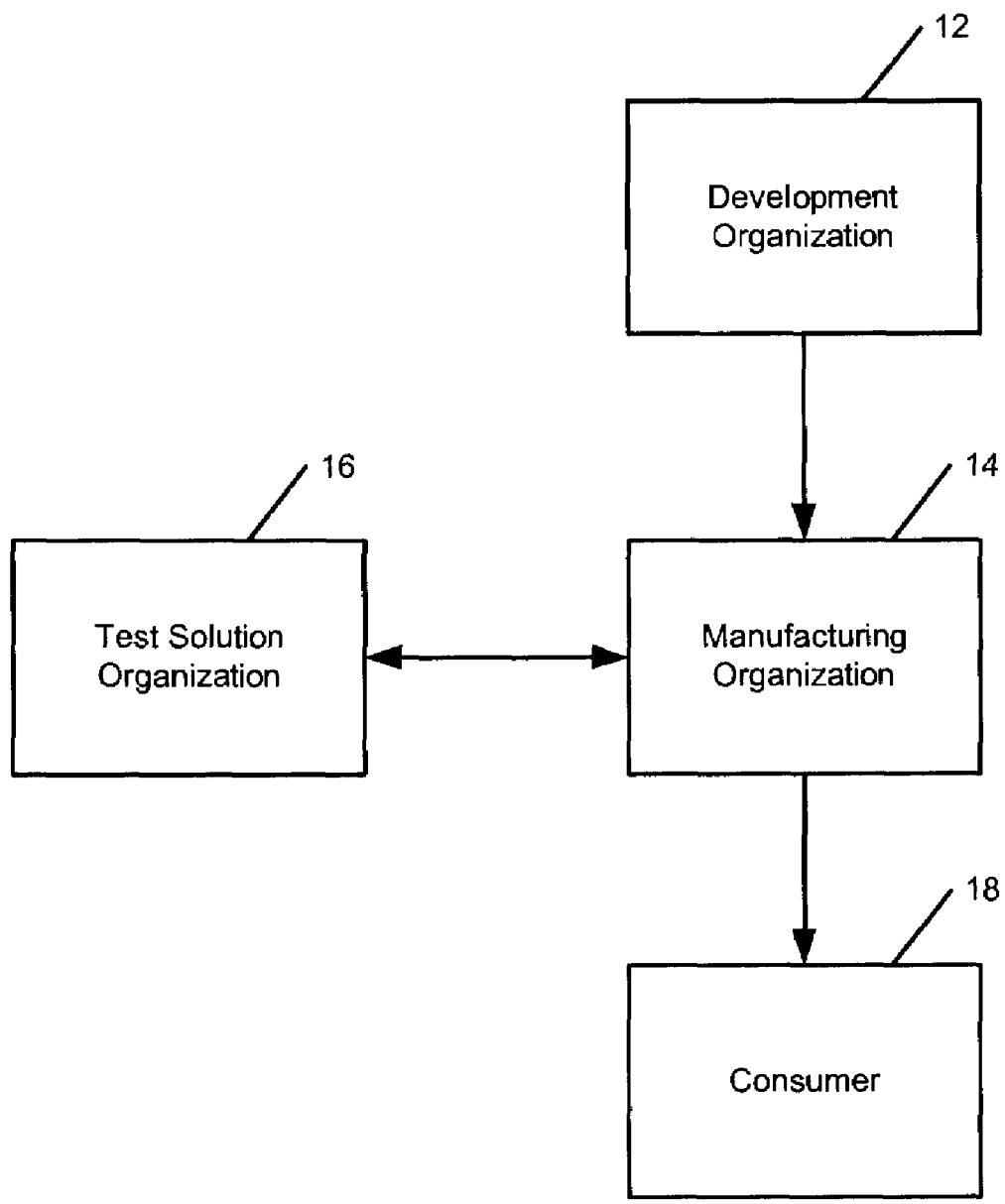
FIG. 1 is a functional block diagram depicting conventional interactions between organizations during development of a communication circuit.
Figure 2:
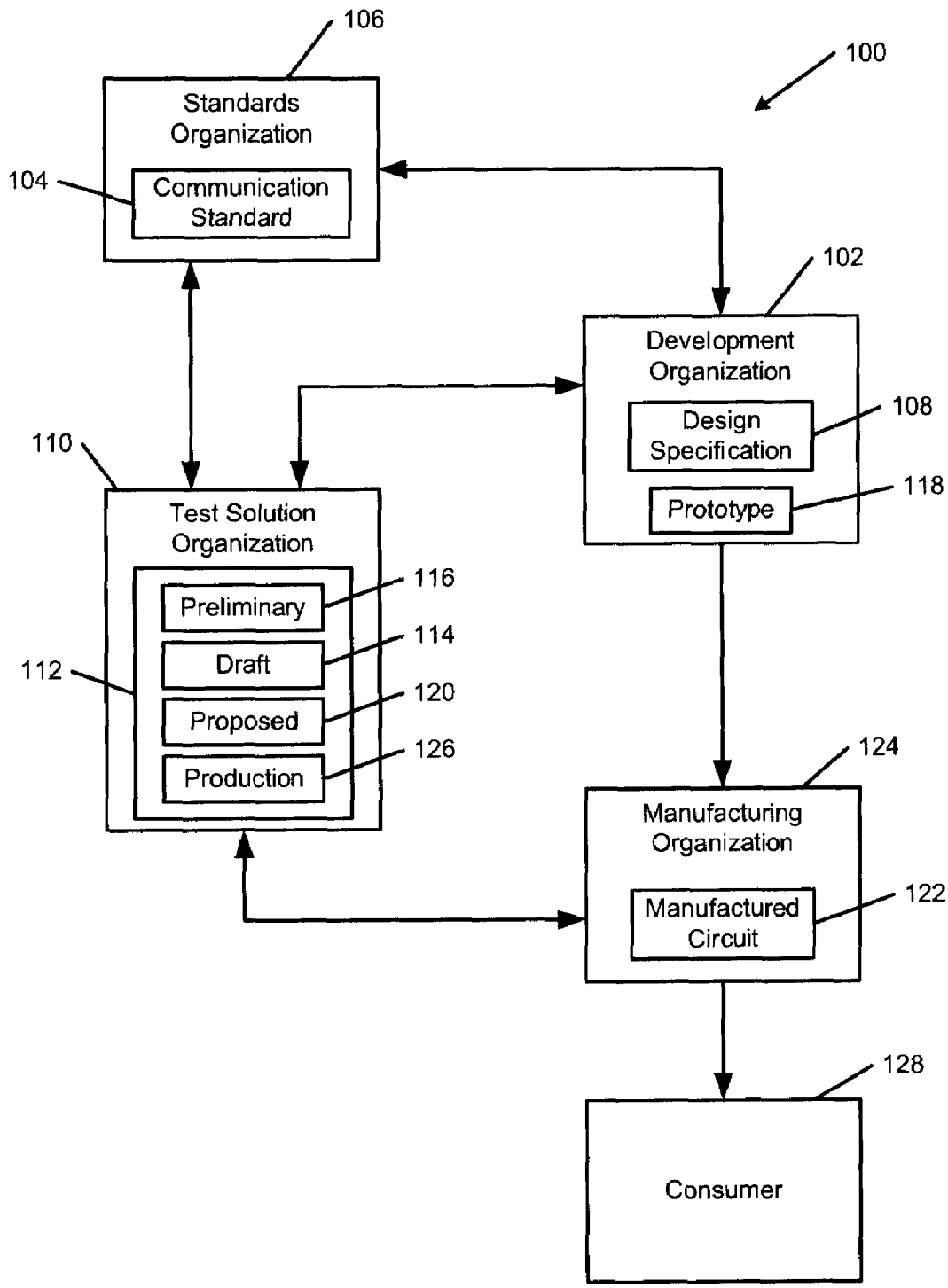
FIG. 2 is a functional block diagram depicting exemplary interactions between organizations during development of a communication circuit and a test solution for the communication circuit in accordance with one embodiment of the presently claimed invention.

Referring now to FIG. 2, a functional block diagram depicting exemplary interactions between organizations during development of an integrated circuit implementing a communication standard is generally depicted at 100. A development organization 102 designs and develops circuits that substantially conform to a communication standard 104 created by a standards organization 106 such as IEEE. Exemplary communication standards include IEEE 802.11, 802.16, 802.22, and/or other suitable communication standards. The development organization 102 creates a design specification 108 for the circuit (or a portion of the circuit) that substantially conforms with the communication standard 104.

A test solution organization 110 designs and develops a test solution 112 to verify that the circuit substantially conforms with the design specification 108 and/or the communication standard 104. The test solution 112 may include test hardware and/or test software. Exemplary test solutions are disclosed in U.S. patent application Ser. No. 10/770,020, filed Feb. 2, 2004; Ser. No. 10/770,298, filed Feb. 2, 2004; Ser. No. 10/769,971, filed Feb. 2, 2004; Ser. No. 10/908,946, filed Jun. 1, 2005; Ser. No. 11/004,723, filed Dec. 3, 2004; Ser. No. 11/160,673, filed Jul. 5, 2005; Ser. No. 11/161,692, filed Aug. 12, 2005; Ser. No. 11/533,987, filed Sep. 21, 2006; Ser. No. 11/422,475, filed Jun. 6, 2006; Ser. No. 11/279,778, filed Apr. 14, 2006; Ser. No. 11/422,489, filed Jun. 6, 2006; Ser. No. 11/533,971, filed Sep. 21, 2006; which are incorporated herein by reference in their entirety.

The test solution organization 110 receives the design specification 108 from the development organization 102 and the communication standard 104 from the standards organization 106. The test solution organization 104 designs a draft test solution 114 based on the design specification 108. In some cases, the test solution organization 104 may design a preliminary test solution 116 based on the communication standard 104. The preliminary test solution 116 can then be modified to conform with the design specification 108 in order to create the draft test solution 114.

The test solution organization 110 receives a prototype 118 of the circuit that substantially conforms with the design specification 108. In most cases, the prototype 118 is received from the development organization 102. However, the prototype 118 may be received from a prototype development organization (not shown) that is capable of producing the prototype 118.

The test solution organization 110 evaluates the draft test solution 114 based on an interaction with the prototype 118. More specifically, the draft test solution 114 transmits one or more signals to the prototype 118 and/or receives one or more signals from the prototype 118. The test solution organization 110 determines whether the prototype 118, as exercised by the draft test solution 114, substantially conforms with the design specification 108 and/or the communication standard 104 based on the signals.

The test solution organization 110 selectively modifies the draft test solution 114 based on the interaction with the prototype 118 to produce a proposed test solution 120. More specifically, when the prototype 118, as exercised by the draft test solution 114, substantially conforms with the design specification 108 and/or the communication standard 104, the test solution organization 110 produces the proposed test solution 120 based on the draft test solution 114. However, when the prototype 118, as exercised by the draft test solution 114, does not substantially conform, the test solution organization 110 selectively modifies the draft test solution 114 to produce the proposed test solution 120.

The test solution organization 110 receives a manufactured circuit 122 that substantially conforms with the design specification 108 from a manufacturing organization 124. The manufacturing organization 124 is typically in a different geographical location than the development organization 102. The test solution organization 110 evaluates the proposed test solution 120 based on an interaction with the manufactured circuit 122. More specifically, the proposed test solution 120 transmits one or more signals to the manufactured circuit 122 and/or receives one or more signals from the manufactured circuit 122. The test solution organization 110 determines whether the manufactured circuit 122, as exercised by the proposed test solution 122 substantially conforms with the design specification 108 and/or the communication standard 104 based on the signals.

The test solution organization 110 selectively modifies the proposed test solution 120 based on the interaction with the manufactured circuit 122 to produce a production test solution 126. More specifically, when the manufactured circuit 122, as exercised by the proposed test solution 120, substantially conforms with the design specification 108 and/or communication standard 104, the test solution organization 110 produces the production test solution 126 based on the proposed test solution 120. However, when the manufactured circuit 122, as exercised by the proposed test solution 120, does not substantially conform, the test solution organization 110 selectively modifies the proposed test solution 120 to produce the production test solution 126.

In this manner, the test solution organization 110 provides the production test solution 126 to the manufacturing organization 124 quicker than by conventional methods. In some cases, the manufacturing organization 124 may receive the design specification 108 and the production test solution 126 at substantially the same time. The manufacturing organization 124 may use the production test solution 126 as a quality control measure to minimize defective circuits from reaching a consumer 128. By minimizing defective circuits from reaching the consumer 128, costs to produce the manufactured circuits 122 may decrease.

Figure 3:
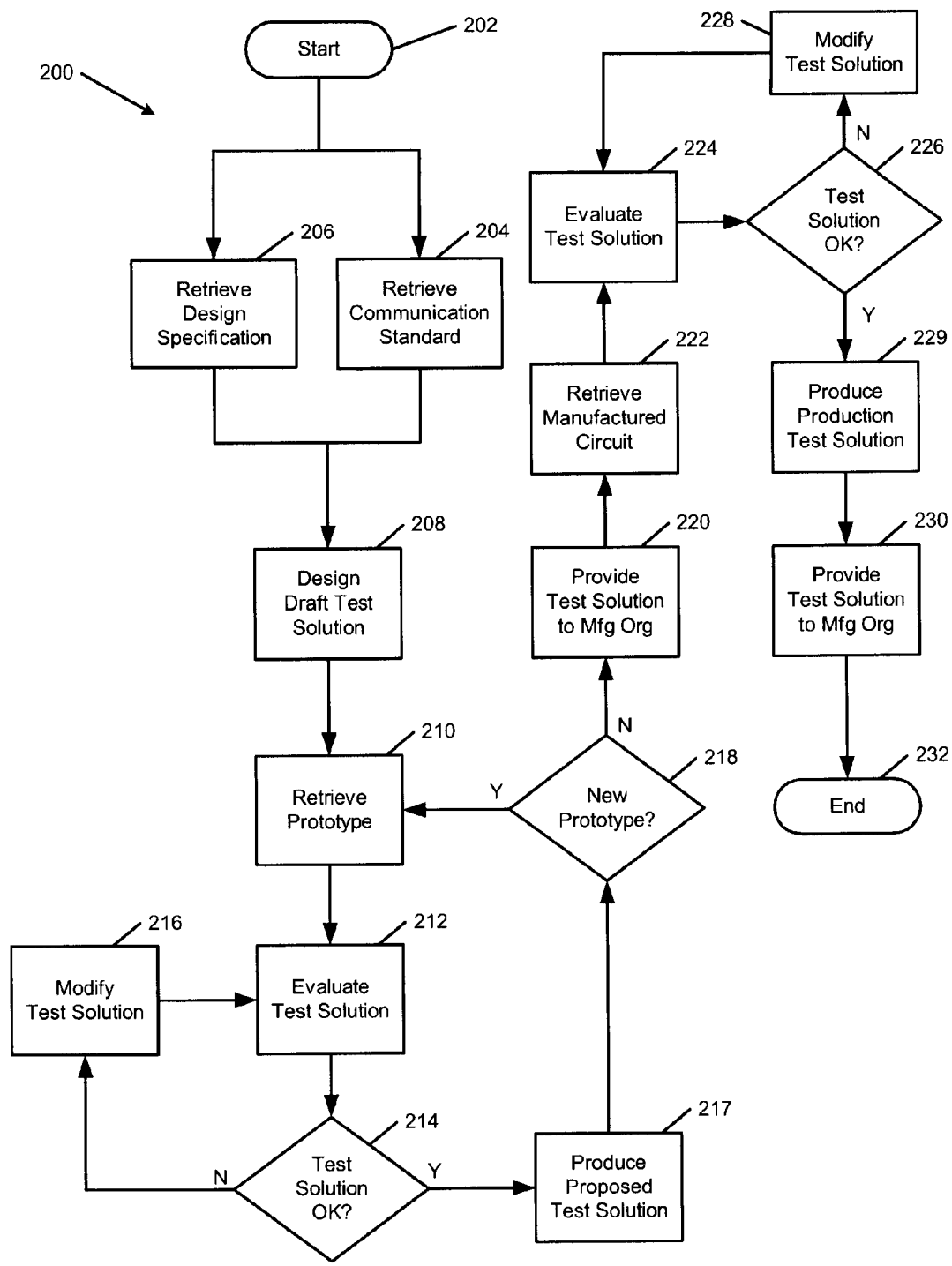
FIG. 3 is a flowchart depicting exemplary steps that may be taken by a test solution organization when developing the test solution for the communication circuit in accordance with one embodiment of the presently claimed invention.

Referring now to FIG. 3, a flowchart illustrating exemplary steps that may be taken by the test solution organization 110 to develop the test solution 112 are generally depicted at 200. The process starts in step 202 when the development organization 102 begins to create the design specification 108. The test solution organization 110 retrieves the communication standard 104 and the design specification 108 in steps 204 and 206, respectively. The communication standard 104 is retrieved from the standards organization 106 and the design specification 108 is retrieved from the development organization 102.

In step 208, the test solution organization 110 designs the draft test solution 114 based on the design specification 108 and/or the communication standard 104. In step 210, the test solution organization 110 retrieves the prototype 210 that substantially conforms with the design specification 108 from the development organization 102.

The test solution organization 110 evaluates the draft test solution 114 in step 212. More specifically, the test solution organization 110 evaluates the draft test solution 114 based on an interaction with the prototype 118. As previously discussed, the interaction is based on one or more signals transmitted to and/or received from the prototype 118.

In step 214, the test solution organization 110 determines whether the prototype 118, as exercised by the draft test solution 114, substantially conforms with the design specification 108 and/or the communication standard 104. As previously discussed, the test solution organization 110 determines whether the prototype 118, as exercised by the draft test solution 114, substantially conforms with the design specification 108 and/or the communication standard 104 based on the interaction with the prototype 118.

If the prototype 118, as exercised by the draft test solution 114 does not substantially conform, the test solution organization 110 selectively modifies the draft test solution 114 in step 216 and the process returns to step 212. However, if the test solution organization 110 determines that the prototype 118, as exercised by the draft test solution 114, does substantially conform in step 214, the test solution organization 110 produces the proposed test solution 120 based on the draft test solution 114 in step 217.

In step 218, the test solution organization 110 determines whether the development organization 102 has created an additional prototype that is substantially different from the prototype 118. If the development organization 102 has created the additional prototype, the process returns to step 210. However, if the test solution organization 110 determines that the development organization 102 has not created the additional prototype in step 218, the test solution organization 110 provides the proposed test solution 120 to the manufacturing organization 124 in step 220.

In step 222, the test solution organization 110 retrieves the manufactured circuit 122 from the manufacturing organization 124. As previously discussed, the manufactured circuit 122 is created by the manufacturing organization 124 and substantially conforms with the design specification 108 and/or the communication standard 104.

The test solution organization 110 evaluates the proposed test solution 120 in step 224. More specifically, the test solution organization 110 evaluates the proposed test solution 120 based on an interaction with the manufactured circuit 122. As previously discussed, the interaction is based on one or more signals transmitted to and/or received from the manufactured circuit 122.

In step 226, the test solution organization 110 determines whether the manufactured circuit 122, as exercised by the proposed test solution 120, substantially conforms with the design specification 108 and/or the communication standard 104. As previously discussed, the test solution organization 110 determines whether the manufactured circuit 122, as exercised by the proposed test solution 120, substantially conforms with the design specification 108 and/or the communication standard 104 based on the interaction with the manufactured circuit 122.

If the proposed test solution 120 does not substantially conform, the test solution organization 110 selectively modifies the proposed test solution 120 in step 228 and the process returns to step 224. However, if the test solution organization 110 determines that the manufactured circuit 122, as exercised by the proposed test solution 120, does substantially conform in step 226, the test solution organization 110 produces the production test solution 126 based on the proposed test solution 120 in step 229.

In step 230, the test solution organization 110 provides the production test solution 126 to the manufacturing organization 124. The process ends in step 232.

In this manner, the test solution organization 110 employs a method that follows development of a communication circuit from initial concept to mass production. The method follows the value chain of circuit development and is therefore independent of geographical locations. In addition, the method allows the test solution organization 110 to provide a test solution suitable for mass production of circuits quicker than conventional methods, which may reduce associated costs. Other advantages will be recognized by those of ordinary skill in the art.

Various other modifications and alternations in the structure and method of operation of this invention will be apparent to those skilled in the art without departing from the scope and the spirit of the invention. Although the invention has been described in connection with specific embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of developing a test solution for one or more integrated circuits (ICs) implementing a communication standard, comprising:
   receiving a design specification for at least a portion of said one or more ICs from a development organization;
   receiving a communication standard for said one or more ICs;
   designing a draft test solution for said one or more ICs in at least substantial conformance with said communication standard and design specification;
   receiving at least one prototype of said one or more ICs from said development organization;
   evaluating said draft test solution based on at least one interaction between said at least one prototype and said draft test solution;
   selectively modifying said draft test solution based on said at least one Interaction to produce a proposed test solution;
   receiving, from one or more entities including a manufacturing organization, at least one of each of said one or more ICs at least a portion of which is manufactured substantially in conformance with said design specification;
   evaluating said proposed test solution based on at least another interaction between said manufactured one or more ICs and said proposed test solution; and
   selectively modifying said proposed test solution based on said at least another interaction to produce a production test solution.

2. The method of claim 1 wherein said development organization and said manufacturing organization are in different geographical locations.

* * * * *